United States Patent
Crouse et al.

(10) Patent No.: US 7,537,870 B2
(45) Date of Patent: May 26, 2009

(54) LITHOGRAPHY PROCESS OPTIMIZATION AND SYSTEM

(75) Inventors: Michael Matthew Crouse, Hopewell Junction, NY (US); Yasri Yudhistira, Singapore (SG)

(73) Assignees: Chartered Semiconductor Manufacturing, Ltd., Singapore (SG); International Business Machines Corporation, Armonk, NY (US)

( * ) Notice: Subject to any disclaimer, the term of this patent is extended or adjusted under 35 U.S.C. 154(b) by 213 days.

(21) Appl. No.: 11/452,865

(22) Filed: Jun. 13, 2006

(65) Prior Publication Data

US 2007/0031744 A1 Feb. 8, 2007

Related U.S. Application Data

(60) Provisional application No. 60/774,382, filed on Feb. 17, 2006, provisional application No. 60/706,202, filed on Aug. 5, 2005.

(51) Int. Cl.
*G03F 9/00* (2006.01)
(52) U.S. Cl. .............. 430/30; 430/5; 355/53; 355/67
(58) Field of Classification Search ........ 430/5, 430/30; 355/53, 67
See application file for complete search history.

(56) References Cited

U.S. PATENT DOCUMENTS

| | | | |
|---|---|---|---|
| 6,556,277 | B2 | 4/2003 | Pierrat |
| 6,563,566 | B2 | 5/2003 | Rosenbluth et al. |
| 6,839,126 | B2 | 1/2005 | Yen et al. |
| 6,930,754 | B1 | 8/2005 | Sugita et al. |
| 2003/0103196 | A1 | 6/2003 | Hirukawa |
| 2004/0201831 | A1 | 10/2004 | Tyminski |
| 2005/0018164 | A1 | 1/2005 | Hansen |
| 2005/0221233 | A1 | 10/2005 | Minvielle |

OTHER PUBLICATIONS

Liebmann et al., Layout Methodology Impact of Resolution Enhancement Techniques; Unknown title of item; Unknown publication date; Unknown page numbers (7 total pages); Present on web site "www.eda.org/edps/edp03/submissions/edp_liebmann_2003.pdf" as of Jul. 2, 2007.

Levenson et al.; The Vortex Via Process: Analysis and Mask Fabrication for Contact CDs <80nm; "Copyright 2003 Society of Photo-Optical Instrumentation Engineers. This paper was (will be) published in Proc. SPIE 5040-32 . . . "; Unknown page numbers (numbered 1 to 27).

*Primary Examiner*—Christopher G Young
(74) *Attorney, Agent, or Firm*—Horizon IP Pte Ltd

(57) ABSTRACT

The first and second example embodiments are Pattern Fidelity Optimization Procedures for a Multiple Exposure Scheme. In the third example embodiment, the aperatures from the multiple exposure system can be combined into a single aperture by adding the apertures and modulating the relative transmission thru the respective apertures to match the prescribed dose split determined in above in the first embodiment.

20 Claims, 10 Drawing Sheets

LITHOGRAPHY PROCESS OPTIMIZATION AND SYSTEM

CROSS REFERENCE

This patent application is a regular patent application (non-provisional) that claims priority at least under 35 U.S.C. 119(e) from the US provisional patent applications:

Ser. No. 60/706,202, Filing date Aug. 5, 2005, entitled Lithography process optimization via linear superposition of multiple images with single reticle, first named inventor Michael Matthew Crouse, Hopewell Junction, N.Y.;

and Ser. No. 60/774,382, Filing date Feb. 17, 2006, entitled Lithography process optimization, first named inventor Michael Matthew Crouse, Hopewell Junction, N.Y., both which are incorporated herein by reference for all purposes.

BACKGROUND OF INVENTION

1) Field of the Invention

The invention relates generally to photolithography processes and equipment for photolithography, and more particularly relates to a method for optimizing the conditions of illumination of a lithographic apparatus.

2) Description of the Prior Art

Photolithography is a well-known process for transferring geometric shapes present on a photomask onto a resist layer over a substrate. In lithographic processing, a photosensitive polymer film called photoresist is normally applied over a substrate and then allowed to dry. An exposure tool is utilized to expose the wafer with the proper geometrical patterns through a mask by means of a source of light or radiation. After exposure, the wafer is treated to develop the mask images transferred to the photosensitive material. These masking patterns are then used to create the device features of the circuit.

A lithographic apparatus is a machine that applies a desired pattern onto a target portion of a substrate. Lithographic apparatus can be used, for example, in the manufacture of integrated circuits (ICs). In that circumstance, a patterning device (or patterning structure), which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

A simplified diagram of a conventional exposure tool is shown in FIG. 1. As can be seen, light source 1100 projects light waves 1108 through opening 1102 in aperture stop 1101. Opening 1102 is commonly referred to as the aperture or pupil of the aperture stop. Condenser lens 1105 collects the light from the opening 1102 and focuses it on mask 1106 such that the mask 1106 is evenly illuminated. When illuminating beam 1103 passes through mask 1106, imaging beam 1109 is generated. Imaging beam 1109 is projected through projection lens 1107 such that the image of the pattern on the mask 1106 is focused onto the resist 1111 over the substrate or wafer 1110. As can be seen in FIG. 1, the opening 1102 is situated in the center of aperture stop 1101. Because of this, illuminating beam 1103 is projected along the optical axis (dashed line 1104) from the opening 1102 to condenser lens 1105 and mask 1106. This type of illumination method is called "On-axis illumination,"—the name implying that the illumination beam is "on" the optical axis.

One of the goals in integrated circuit fabrication is to faithfully reproduce the original design on the substrate (via the mask). As the demand to image smaller and smaller features in the semiconductor manufacturing process has continued unabated, the limitations of optical lithography that were once accepted have been exceeded repeatedly.

A theoretical estimate of the limits of pattern printing can be given by the Rayleigh criterion for resolution R as shown in equation (a):

$$1R = k_1 * \lambda NA \qquad (a)$$

where $\lambda$ is the wavelength of the radiation used, NA is the numerical aperture of the projection system and $k_1$ is a Rayleigh constant (process dependent adjustment factor).

It follows from equation (a) that the resolution can be improved in three ways: by shortening the exposure wavelength $\lambda$, by increasing the numerical aperture NA or by decreasing the value of $k_1$. All of these strategies have been pursued simultaneously in the past and are expected to continue to be pursued in the future.

The performance of a lithographic apparatus and its limitation may also be explained and characterized with the depth of focus (DOF), which is generally viewed as one of the most critical factors in determining the resolution of the lithographic projection apparatus. The DOF, defined in equation (b), is defined as the distance along the optical axis over which the image of the pattern is adequately sharp.

$$DOF = +/- k_2 * \lambda NA2 \qquad (b)$$

where $k_2$ is an empirical constant.

Additional important responses/measures that provide more insight into the real difficulties associated with photolithography at the resolution limit include the exposure latitude (EL), the dense: isolated bias (DIB), and the mask error enhancement factor (MEEF). The exposure latitude describes the percentage dose range where the printed pattern's critical dimension (CD) is acceptable, typically 10%. It is used along with the DOF to determine the process window, i.e. the regions of focus and exposure that keep the final resist profile within prescribed specifications. As for the DIB, it is a measure of the size difference between similar features, depending on the pattern density. Finally, the MEEF describes how mask CD errors are transmitted into substrate CD errors.

As the semiconductor industry moves into the deep submicron regime, the resolution limit of currently available lithographic techniques is being reached due to a decrease in the depth of focus, difficulty in the design of projection system and complexities in the projection system fabrication technology. In order to address this issue, there have been continued endeavors to develop resolution enhancement techniques.

Historically, the resolution limit of a lithographic projection apparatus was optimized by the control of the relative size of the illumination system numerical aperture (NA). Control of this NA with respect to the projection system's NA allows for modification of spatial coherence at the mask plane, commonly referred to as partial coherence σ. This is accomplished, for example, through specification of the condenser lens pupil in a Köhler illumination system. Essentially, this allows for manipulation of the optical processing of diffraction information. Optimization of the partial coherence of a projection imaging system is conventionally accomplished using full circular illumination apertures. By controlling the distribution of diffraction information in the projection system with the illuminator pupil size, maximum image modulation can be obtained. Illumination systems can be further refined by considering variations to full circular illumination apertures. A system where illumination is obliquely incident on the mask at an angle so that the zero-th and first diffraction orders are distributed on alternative sides of the optical axis may allow for improvements. Such an approach is generally referred to as off-axis illumination.

Off-axis illumination improves resolution by illuminating the mask with radiation that is at an angle to the optical axis of the projection system. The angular incidence of the radiation on the mask, which acts as a diffraction grating, improves the contrast of the image by transmitting more of the diffracted orders via the projection system. Off-axis illumination techniques used with conventional masks produce resolution enhancement effects similar to resolution enhancement effects obtained with phase shifting masks.

Various other enhancement techniques that have been developed to increase the resolution and the DOF include optical proximity correction (OPC) of optical proximity errors (OPE), phase-shift masks (PSM), and sub-resolution assist features (SRAF). Each technique may be used alone, or in combination with other techniques to enhance the resolution of the lithographic projection apparatus.

Currently available illumination intensity distributions or arrangements include small, or low, sigma conventional, annular, quadrupole, and QUASAR, with the illuminated areas (hereinafter referred to as the aperture(s)). The annular, quadrupole and QUASAR illumination techniques are examples of off-axis illumination schemes. Quadrapole Illumination—a light source where light is split through four round openings located away from the optical axis of an illumination system. Quadrapole illumination is a type of off axis illumination and improves the minimum feature that an exposure system can resolve for a given wavelength.

Small sigma illumination is incident on the mask with approximately zero illumination angle (i.e. almost perpendicular to the mask) and produces good results with phase shifting masks to improve resolution and increase the depth of focus. Annular illumination is incident on the mask at angles that are circularly symmetrical and improves resolution and increases depth of focus while being less pattern dependent than other illumination schemes. Quadrupole and QUASAR illumination are incident on the mask with four main angles and provide improved resolution and increased depth of focus while being strongly pattern dependent.

There is a challenge to improve the quality and reduce the size of the masking patterns.

SUMMARY OF THE INVENTION

In a first example embodiment we describe a method to design an optimized multi-exposure process. In a second example embodiment we describe a multi-exposure process that uses the design of the first embodiment. In third example embodiment, we describe a method and device for single exposure process using a composite aperture using the results from the first example embodiment.

The first example embodiment is a method to optimize the optical transfer of a pattern onto photoresist using two or more exposure processes comprising:
  providing a photomask design to print a photoresist pattern with at least a first type pattern and a second type pattern;
  determining a first exposure process using a first illumination condition that will improve at least a pattern fidelity parameter for the first type pattern;
    the first illumination condition comprises a first aperture;
  the first illumination condition is determined to improve at least the pattern fidelity parameter for the first type pattern transfer onto the photoresist;
  determining a second exposure process using a second illumination condition that will improve at least the pattern fidelity parameter for the second type pattern;
    the second illumination condition comprises a second aperture;
  the second illumination condition is determined to improve at least the pattern fidelity parameter for the second type pattern transfer onto the photoresist from the photomask design; then
  determining a first exposure dose for the first exposure process and a second exposure dose for the second exposure process that optimize the pattern fidelity parameter for the both the first type pattern and second type pattern type.

A second example embodiment comprises the method of the first embodiment above and which further comprises:
  providing a substrate having a photoresist formed thereover
  providing a photomask formed using the photomask design aligned above the substrate;
  performing a first exposure through the photomask at the first dose and with the first illuminating condition;
  performing a second exposure through the photomask at the second dose and with the second illuminating condition.

A third example embodiment is a method to make a composite aperture design for an optical transfer of a pattern onto photoresist using one exposure process comprising:
  providing a photomask design to print a photoresist pattern with at least a first type pattern and a second type pattern;
  determining a first exposure process using a first illumination condition that will improve at a pattern fidelity parameter for the first type pattern;
    the first illumination condition comprises a first aperture;
  the first illumination condition is determined to optimize at least a pattern fidelity parameter for the first type pattern transfer onto the photoresist;
  determining a second exposure process using a second illumination condition that will improve at least the pattern fidelity parameter for the second type pattern;
    the second illumination condition comprises a second aperture; the first aperture and the second aperture have different configurations;
  the second illumination condition is determined to optimize at least the pattern fidelity parameter for the second type pattern transfer onto the photoresist from the photomask design; then
  determining a first exposure dose for the first exposure process and a second exposure dose for the second exposure process that optimize the pattern fidelity parameter for the both the first type pattern and second type pattern type;
  making a composite aperture design by combining the first aperture and second apertures to form a composite aperture design;
  designing a modulating means for modulating the relative transmission through the first aperture and second aperture to allow the first exposure dose and second exposure dose through the first and second apertures of the composite aperture design.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of the example embodiments according to the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

Some example embodiments of present invention provide a photolithography process with multiple exposures through a single photomask to pattern a photoresist layer formed on a wafer.

Some example embodiments provide a method to design and form a composite aperture and modulating means.

In a first example embodiment we describe a method to design an optimized multi-exposure process. In a second example embodiment we describe a multi-exposure process that uses the design of the first embodiment. In third example embodiment, we describe a method and device for single exposure process using a composite aperture using the results from the first example embodiment.

I. First Example Embodiment

A Method to Design an Optimized Multi-Exposure Process

Figures 3A, 3B:
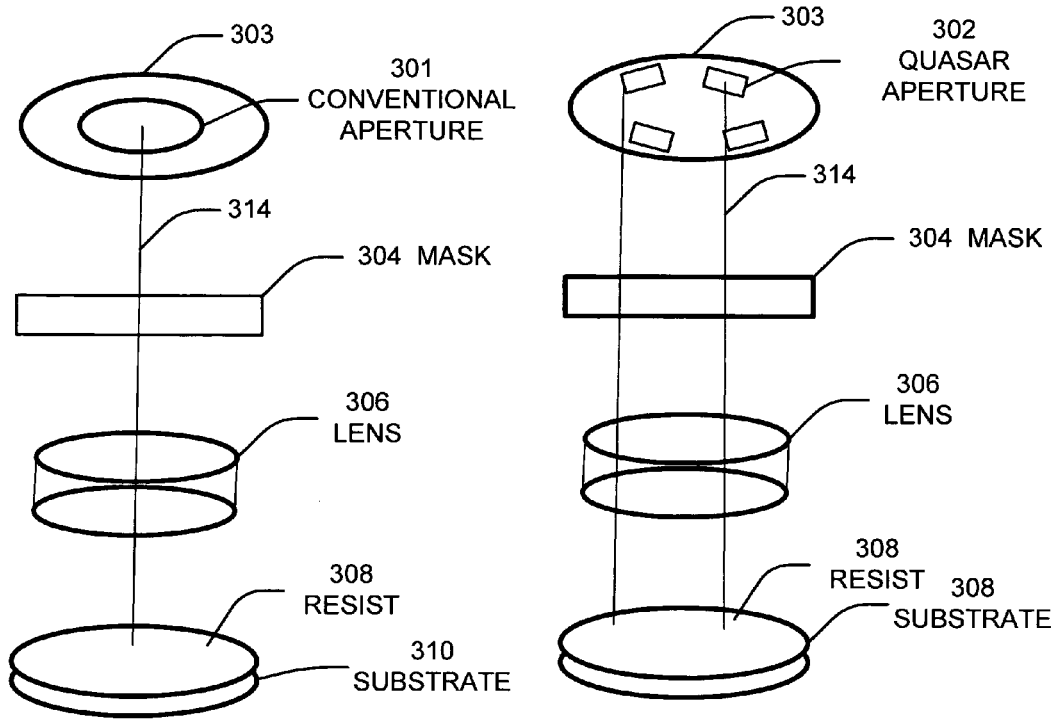
FIGS. 3A and 3B show simplified schematic representations of an example of the embodiment's double exposure Pattern Fidelity Optimization Procedure for Multiple Exposure Scheme.

In a first example embodiment, we describe a method to design an optimized multi-exposure process. FIGS. 3A and 3B show an example of two exposure process using two different illumination conditions and at selected doses that optimize a selected pattern fidelity parameter for both a first pattern type and a second pattern type.

A. Provide a Photomask Design to Print a Photoresist Pattern with at Least a First Type Pattern and a Second Type We provide a photomask design to print a photoresist pattern with at least a first type pattern and a second type pattern. There can be one to n type patterns. The type patterns have features that can be advantageously patterned using different illumination conditions.

The photomask design can be a computer rendered design. The photomask design can be used to make a photomask (e.g., reticle) The photomask design and photomask also have first and second type patterns that are transferred onto a photoresist layer with a exposure and development process.

Pattern Types

The pattern types are groups (or regions) of features that can be improved by using different illumination conditions. Non-limiting examples of features are lines, line and space arrangements; contact holes and ellipses of various aspect ratios, long trenches within the resist, L-bar shapes and general 2-D features, and combinations thereof etc.

Other examples of different pattern types are features that can have different 1) rayleigh constant ranges, 2) feature shapes or feature shape types, and/or 3) feature orientations.

Figure 2A:
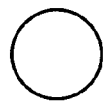
FIG. 2A shows an about circular contact hole feature shape according to an example embodiment of the invention.
Figure 2B:
FIG. 2B shows an elliptical contact hole feature shape according to an example embodiment of the invention.

Examples of three pattern types defined by different Rayleigh contact ranges are:

a highly nested pattern has a Rayleigh constant ($K_1$) less than or equal to 0.5;

semi nested pattern type has a Rayleigh constant ($K_1$) between 0.5 to 0.75 isolated pattern type has a Rayleigh constant ($K_1$) greater than or =0.75;

An example of different feature shapes (types) is circular contact holes vs trench patterns or long stretched contact pattern with various length. For example FIG. 2A shows an about circular contact hole and FIG. 2B shows an elliptical contact hole.

Figure 2C:
FIG. 2C shows lines at about 90 angles feature shape according to an example embodiment of the invention.
Figure 2C:
Figure 2D:
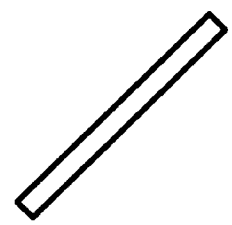
FIG. 2D shows lines at about 45 degrees angles feature shape according to an example embodiment of the invention.
Figure 2D:
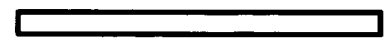

Example of different feature orientations are: horizontal lines, vs vertical lines vs angled lines (not 0 or 90 degree orientation), such as 45 degree lines. For example FIG. 2C shows lines at about 90 angles. FIG. 2D shows lines at about 45 degrees angles.

Figure 2E:
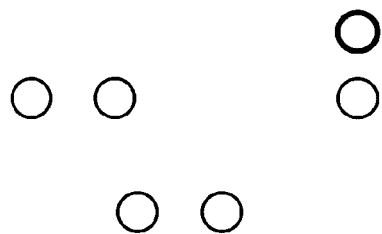
FIG. 2E shows orthogonal contact holes feature shape according to an example embodiment of the invention.
Figure 2F:
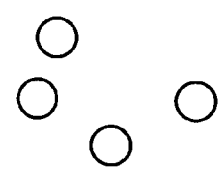
FIG. 2F shows non-orthogonal contact holes feature shape according to an example embodiment of the invention.

An example of different feature orientation is non-orthogonal feature orientations where contact holes are not in the same x or y axis. FIG. 2E shows orthogonal contact holes. FIG. 2F shows non-orthogonal contact holes.

Figure 2G:
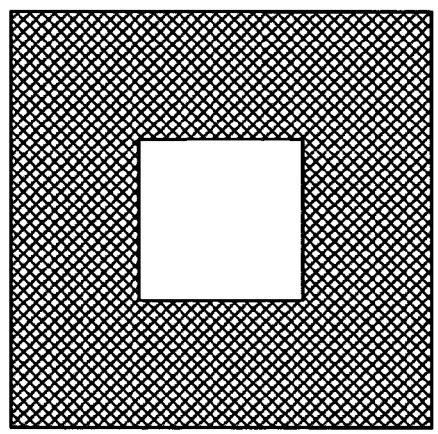
FIG. 2G shows a window feature that resembles resist space feature shape according to an example embodiment of the invention.
Figure 2H:
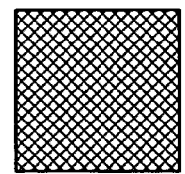
FIG. 2H shows an island feature that resembles resist line feature shape according to an example embodiment of the invention.
Figure 2I:
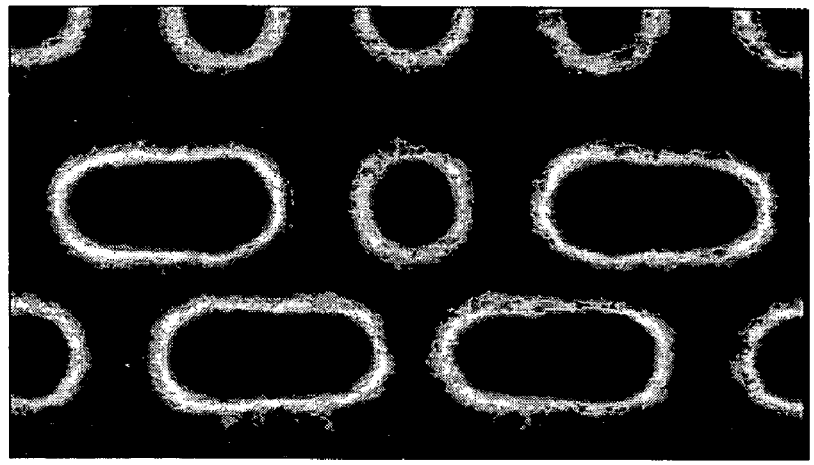
FIG. 2I shows a photograph of an isolated contact and a highly nested group of elongated features. This resist pattern was made using a Composite Illumination Optimized (using an example embodiment of the invention) to print special features in SRAM design.
Figure 2J:
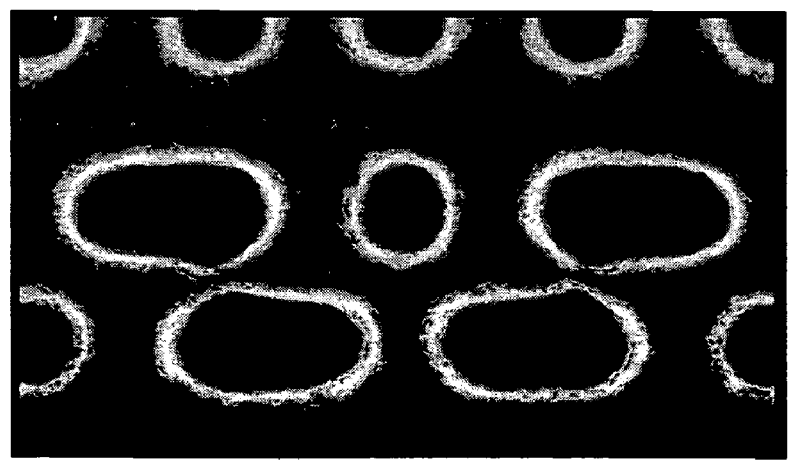
FIG. 2J shows the isolated contact and the highly nested group of elongated features as shown in FIG. 2I this time created using a Standard conventional Illumination with a circular aperture.
Figure 2K:
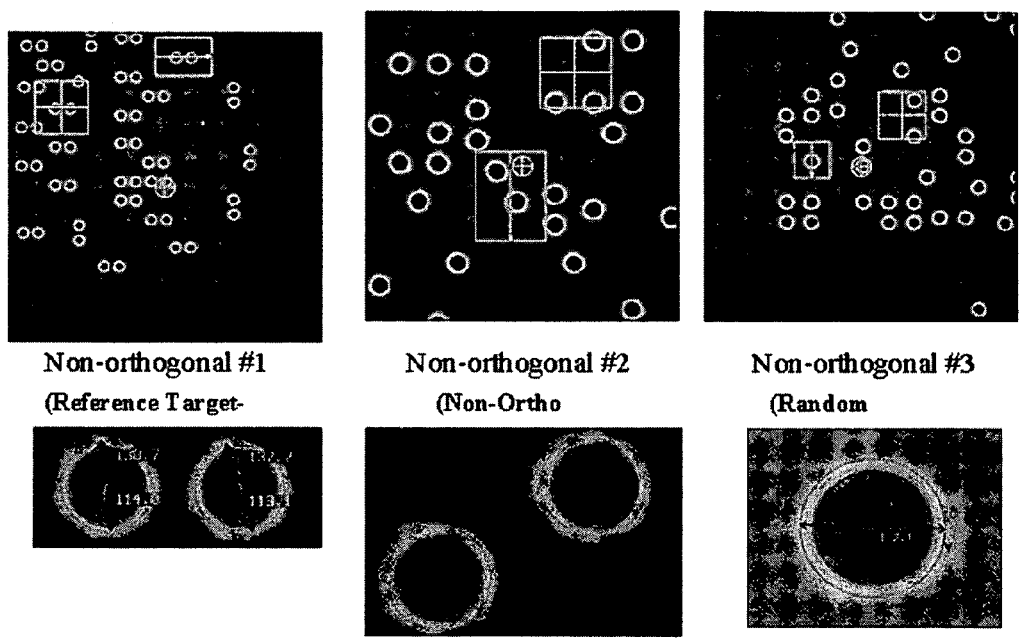
FIG. 2K shows a photograph of Non-orthogonal contacts pattern type according to an example embodiment of the invention.

FIG. 2K shows a photograph of non-orthogonal contact holes. ((1) Reference Target 2) Non-Ortho Target and 3) Random Contact in Logic layout). Three contacts in a random logic are shown FIG. 2K. The first target is a reference target. The second target is a pair of contacts, which most closely approximated a 450 orientation. The third target is a semi-isolated contact at a random pitch common to logic designs.

Another example of different feature shape is island and window feature. As shown in FIG. 2G, a window feature resembles resist space. As shown in FIG. 2H, an island feature resembles resist line.

Another shape example is standard line and line end structure. In this example, one needs to get certain size of line resolution but at the same time to keep line end shortening as small as possible. This is also applicable to space and space end structures.

An aspect is where the pattern types that are not differentiated/defined by duty ratios or duty ratio ranges or Rayleigh constant ranges. The embodiment is applicable to different pattern types that are not defined by the duty ratio or Rayleigh constant.

B. Determining a First Exposure Process Using a First Illumination Condition

We determine a first exposure process using a first illumination condition that will improve or optimize at least a first pattern fidelity parameter for the first type pattern. Preferably the first exposure process using the first illumination condition (not including dose) that will improve or optimize the first pattern fidelity parameter for the first type pattern. The entire reticle is preferably exposed by both first and second (e.g. up to N) exposures.

Illumination condition can comprise illumination parameters including, for example, Numerical Aperture (NA), partial coherence settings, polarization, focus, aperture (opening(s)) shape, aperture area, aperture type (e.g., quadrupole, annular, dipole, etc., shape of opening(s)) and The first illumination condition does not include dose or dose split. Dose split is the percent of full dose split between two or more exposures. The illumination conditions can be set by adjusting the settings of the exposure tool. The aperture can the opening in the aperture stop. The aperture is in general the area where light can be transmitted thru to the mask. The embodiment is not limited to stop plate and can be any type of device that changes the light intensity distribution to the reticle.

An important illumination condition is the aperture type. For example, conventional illumination using a circular aperture is known to be strong in semi-isolated and isolated pattern type (Rayleigh (K) range) and that a Quadrupole aperture is typically weakest in performance for those pattern types.

Preferably, the first aperture and said second aperture have different configurations, (e.g., openings have different areas, locations and/or shapes)

The first illumination condition is determined to optimize at least a first pattern fidelity parameter for the first type pattern transfer onto the photoresist.

The pattern fidelity parameter can include: depth of focus, critical dimension (CD), mask error enhancement factor (MEEF), amount of line-end pullback, process window, common process window, necking, bridging, resist collapse, dose-to-size E1:1, dense to isolated feature bias, arbitrary feature size bias, sidelobe printing, film loss, sidewall angle, resolution and combinations thereof; or weighted combinations thereof or weighted combinations of ranges thereof.

The pattern fidelity parameter can be merit function which can be comprised of some combination of the above parameters. For example the litho performance metric could be a two weighted variables, such as 70% overall DOF and 30% nested feature MEEF.

C. Determining a Second Exposure Process Using a Second Illumination Condition

We then determine a second exposure process using a second illumination condition that will improve at least the first pattern fidelity parameter for the second type pattern.

The second illumination condition comprises a second aperture and can include Na, partial coherence factor, focus, aperture (e.g., pupil shape and area) and pupil type. The first illumination condition does not include dose.

The second illumination condition is determined to optimize at least the first pattern fidelity parameter for the second type pattern transfer onto the photoresist from the photomask design.

It should be noted that the first and second illumination conditions can use the same aperture type, but with different settings. For example, one could use a first quadrupole aperture for the first and a second quadrupole aperture for the second illumination condition, where the first and second quadrupole's have different settings.

D. Determining a First Exposure Dose for the First Exposure Process and a Second Exposure Dose for the Second Exposure Process that Optimize the Pattern Fidelity Parameter for the Both the First Type Pattern and Second Type Pattern Type In a key step, we determine a first exposure dose for the first exposure process and a second exposure dose for the second exposure process that optimize (or balances) the pattern fidelity parameter for the both the first type pattern and second type pattern type. The optimization can the dose split that maximizes the total of the pattern fidelity parameter for the first pattern type plus the pattern fidelity parameter for the second pattern type. (See e.g., FIG. 4).

The Dose Split is simply the fraction of the total energy given to each illumination mode (e.g., aperture type).

If the photomask has 3 or more pattern types, we can perform three or more exposures with dose splits as describe above.

II. Another Example of Process with Multiple Exposures

Aspect of the First Embodiment

Figure 7:
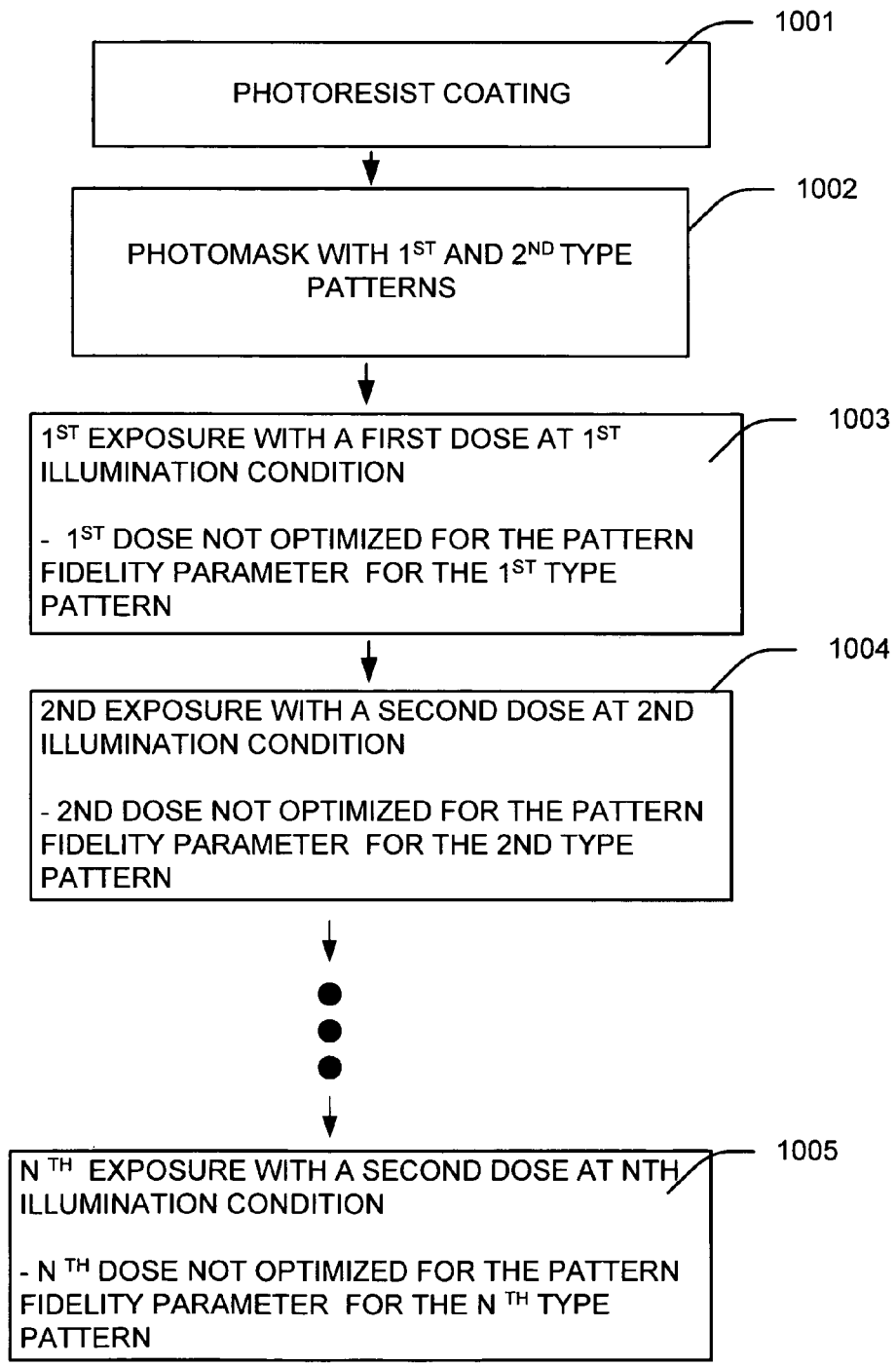
FIG. 7 shows a flowchart of a photolithography process with multiple exposures according to an example embodiment of the present invention.

FIG. 7 shows a flowchart of a photolithography process with multiple exposures according to an example embodiment of the present invention.

In Step 1001, we provide a substrate having a photoresist formed thereover. The substrate can be a wafer or any other suitable structure.

A. Step 1002, Providing a Photomask with a First Type Pattern and a Second Type Pattern In step 1002, we provide a photomask with a first type pattern and a second type pattern formed therein aligned above the wafer. The first and second pattern types are describe above.

B. Performing a First Exposure Through the Photomask at First Dose and with a First Illumination Condition In step 1003, we perform a first exposure through the photomask at first dose and with a first illumination condition.

It is important to note that the dose (e.g., exposure energy) is separate (not part of) from the first illumination condition.

The illumination condition can include illuminating parameters of numerical aperture (NA), sigma value (σ), focus position and pupil type of an exposure tool utilized in the multiple exposures. The illumination conditions are as describe above.

The dose splits for each exposure are a separate parameters that are set to optimize a pattern fidelity parameter or metric(s) for the combination of the first, second . . . nth pattern types.

The first illumination condition is determined to optimize at least a selected pattern fidelity parameter for the first type pattern transfer onto the photoresist from the photomask.

The first dose is not determined to optimize the first pattern fidelity parameter for transfer of the first type pattern onto the photoresist from the photomask.

C. Performing a Second Exposure Through the Photomask at a Second Dose and with a Second Illuminating Condition Referring to step 1004, we perform a second exposure through the photomask at a second dose and with a second illuminating condition.

The second illumination condition is determined to optimize the first pattern fidelity parameter for the second type pattern transfer onto the photoresist from the photomask.

The second dose is not determined to optimize the first pattern fidelity parameter for transfer of the second type pattern onto the photoresist from the photomask.

Preferably, the first and second illumination conditions are different.

D. Determining the Dose Splits

In a key step, the first dose and second dose are determined by optimizing at least the first pattern fidelity metric for (both) the combination of the first type pattern and second type pattern transferred onto the photoresist. The pattern fidelity parameters/metric are describe above.

E. Developing the Photoresist to Form a Photoresist Pattern

Next we develop the photoresist to form a photoresist pattern.

The photolithographic process can further include defining a merit function that is comprised of the process fidelity metrics and determining the first exposure dose for the first exposure process and the second exposure dose for the second exposure process that optimizes the merit function.

F. Examples

Example

Isolated vs Dense Pattern
Type—DOF—Conventional and Quasar Aperture

In an example of the above embodiment, we provide a mask design with two pattern types.
First pattern type is semi-isolated feature
Second pattern type is highly nested features The Pattern fidelity parameter is DOF Based on this we select conventional and quasar type apertures. The conventional aperture will work well on the First pattern type (semi-isolated features). The quasar aperture will work well on the second pattern type (highly nested features).

We select a first exposure process that has first illumination conditions: including a conventional aperture. Note, we have not determined a first dose yet.

FIG. 3A illustrates an example of the first exposure process. The stop plate 303 has a conventional aperture 301. Light 314 passes from a light source thru the aperture 301 thru the mask 304 and lens 306 onto a resist layer 308 over a substrate 310.

We select a second exposure process that has second illumination conditions including a Quasar aperture:

FIG. 3B illustrates the second exposure process. The stop plate 303 has a QUASAR aperture 302. Light 314 passes from a light source thru the aperture 302 thru the mask 304 and lens 306 onto a resist layer 308 over a substrate 310.

Next, we determine the first and second dose to optimize the pattern fidelity pattern for both the first and second pattern types.

Figure 4:
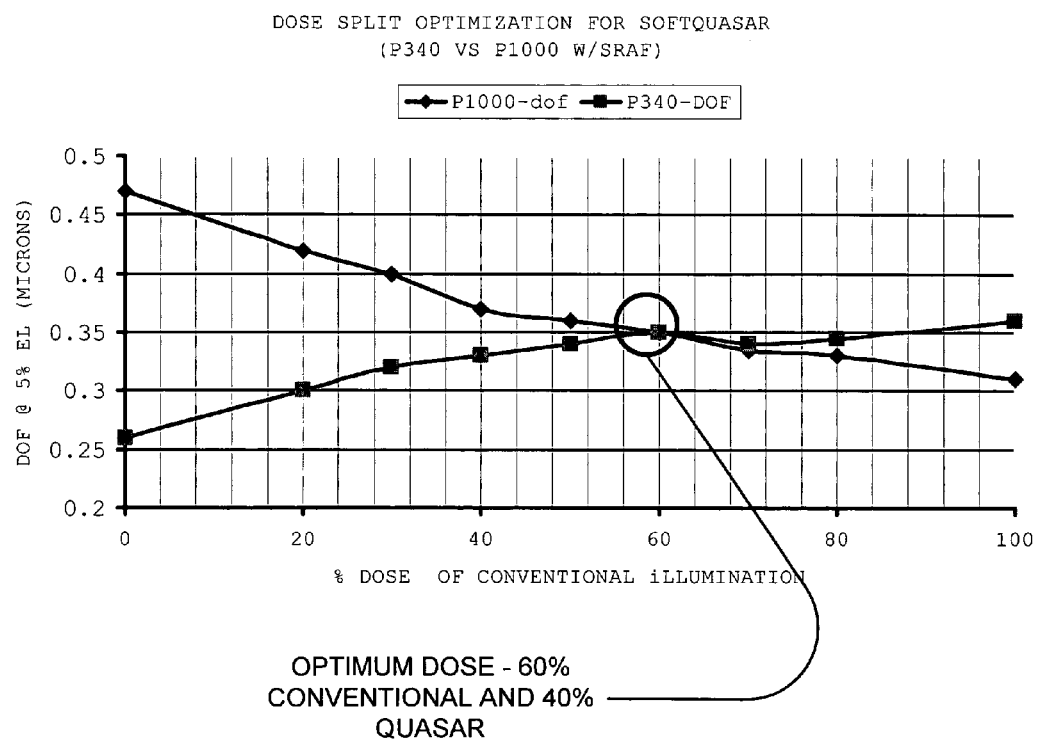
FIG. 4 is a graph of the response of the weakest performance metric (feature) of each given illumination mode (aperture type) as a function of dose according to an example embodiment of the invention.

The procedure here is to map out the response of the weakest performance metric (feature) of each given illumination mode (aperture type) as a function of dose (e.g., as shown in FIG. 4). During the initial sub-component optimization, it will be determined which specific features or pitches within that sub-component optimization are superior and which are somewhat inferior in terms of performance. For example, we know that fully nested features within the Quasar illumination mode demonstrate large Depth-of-Focus. Also, Isolated contacts that have sub-resolution assist features (SRAFs) very close in proximity also behave in a nested way, but less so than fully nested contacts because the SRAFs are of much smaller dimensions than typical contacts to prevent actual printing. Hence, Quasar illumination has the weakest response to Isolated Contacts with SRAFs. Whereas, the other component illumination mode (Conventional) essentially has no response to Isolated Contacts with SRAFs because it is behaving more as a Nested Feature and Conventional has been optimized to produce strong Semi-isolated performance. Hence, Isolated Contacts with SRAFs are chosen as the weakest response of the Quasar component.

Figure 1:
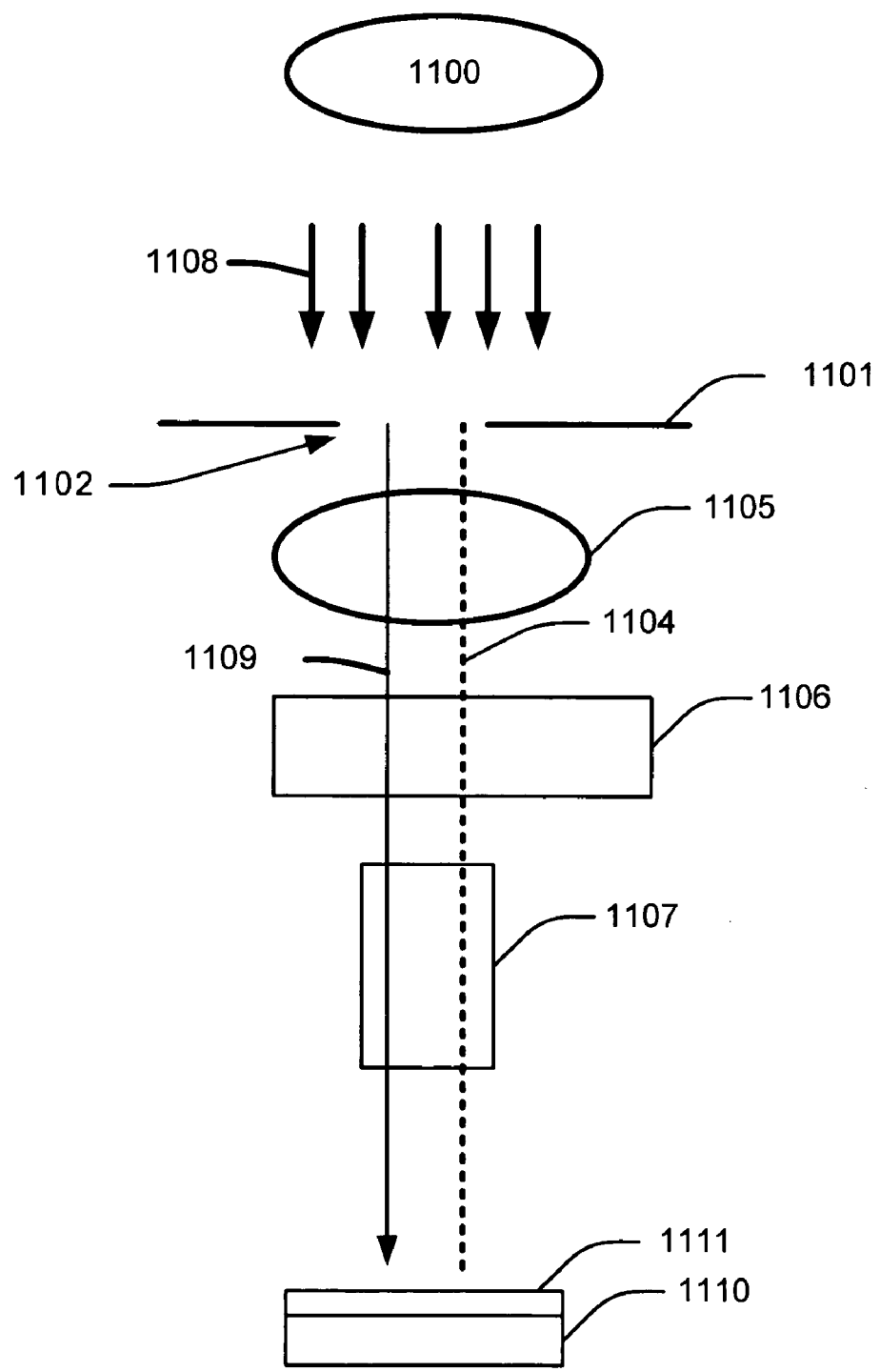
FIG. 1 shows a simplified diagram of a conventional exposure tool according to the prior art.

Referring to FIG. 4, the optimal process point in terms of Dose Split will be defined by the intersection point of these curves. The optimal dose is the point(s) where the total DOF for both pitch ranges (e.g., iso (p1000-DOF w/SRAF) and semi-iso (p340-DOF)) is maximized. (DOF total=DOF (for iso)+DOF for (semi-iso). As is shown in FIG. 1, the optimal Dose Split is 60% Conventional Illumination and 40% Quasar Illumination with a limiting Depth-of-Focus (PW) of 0.34 microns.

In FIG. 4, p1000-DOF is a isolated contacts (pitch 1000 micros) with Sub resolution assist features and p340-DOF is a semi isolated contact (pitch 340 microns)

As shown in FIG. 4, first and second doses (dose splits) are optimized (or balanced) by finding the maximum DOF for both the first pattern type (semi-isolated features) and the second pattern type (highly nested features). The graph below shows the optimum dose is first dose=60% (conventional aperture) and second dose=40% (quasar aperture). Here, the optimum dose yield the maximum value of the DOF(1) (1st pattern type) and DOF(2) ($2^{nd}$ pattern type) (e.g., (DOF(1)=0.348 and DOF(2)=0.347 therefore DOF(total)=0.695) DOF (total) is about the maximum value for the possible dose splits.

The above can be performed by computer simulation, actual runs, or a combination.

The Dose Split optimization has been demonstrated using Depth-of-Focus as the optimizing parameter. However, it is easy to imagine a scheme where we use MEEF, 2-D image fidelity or some additional metric as the optimization parameter. In an even more elegant embodiment, one could produce an optimization function that has each of these metrics listed with a corresponding weight. For example, if Depth-of-Focus is the primary metric, this can be weighted highly with secondary weights on other metrics. This function can then be optimized by finding the Dose Split that provides the highest optimization function value. Standard linear programming techniques can be employed to optimize the given function.

Example

Optimizing 2 Illumination Nodes for (1) SRAM Nested and (2) Isolated Contacts Pattern Types SRAM designs are highly nested arrays of various shapes where features are at high risk shapes merging due to poor print fidelity at these extreme resolution requirements. For these highly nested shapes and to mitigate important line-end pullback behavior, off-axis illumination modes are useful such as Quadrupole. However, Isolated random logic contacts print very poorly under these conditions. To separate these features to more than one reticle is a possible solution, but it is far more expensive approach than determining how to select a combination of these exposures to satisfy both requirements simultaneously.

FIG. 2I shows a photograph of an isolated contact and a highly nested group of elongated features. This resist pattern was made using a Composite Illumination Optimized (using an example embodiment of the invention) to print special features in SRAM design.

FIG. 2J shows the isolated contact and the highly nested group of elongated features as shown in FIG. 2I this time created using a Standard conventional Illumination with a circular aperture. Note the tendency of the resist to erode and allow the shapes to bridge. Note that the example embodiment's pattern shown in FIG. 2I is superior to the conventional illumination shown in FIG. 2J.

This example embodiment involves more than just a Nested vs. Iso kind of optimization, but one more closely tied to pattern fidelity.

Example

Optimizing 2 Illumination Conditions for (1) Line/Space and (2) Contact Holes Pattern Types Another example of two pattern types are (1) line/space and (2) contact holes pattern types. An example embodiment can be used to determine 2 illumination conditions and a dose split to improve the results.

We can use a (1) soft quasar (quad+conv) for contact holes and (2) annular for line/spacer pattern types. The first pattern fidelity parameter we can maximize is DOF MEEF, (for the contact hole pattern type). A second line pattern fidelity parameter we can maximize is the line and pull back for the line/space pattern type.

III. Second Example Embodiment

Multiple Exposure Process

After defining at least the first exposure process with the first dose and first illumination conditions and second exposure process with the second dose and second illumination conditions, we can use this process to expose resist and form a photoresist pattern.

We provide a substrate having a photoresist formed thereover.

We provide a photomask formed using the photomask design aligned above the substrate. The photomask can be mounted in an exposure tool.

A. Perform a First Exposure Through the Photomask at First Dose and with a First Illuminating Condition We perform a first exposure through the photomask at first dose and with a first illuminating condition. The entire substrate or wafer surface is exposed including the first and second pattern types.

FIG. 3A shows an example of the first exposure process.

B. Perform a Second Exposure Through the Photomask at a Second Dose and with a Second Illuminating Condition We perform a second exposure through the photomask at a second dose and with a second illuminating condition. The entire substrate or wafer surface is exposed including the first and second pattern types.

FIG. 3B shows an example of the second exposure process.

If the photomask has 3 or more pattern types, we can perform three or more exposures with dose splits as describe above.

IV. Third Example Embodiment

Design or Form a Composite Aperture

In a third example embodiment, we can use the multi-exposure process from the first embodiment to create a composite aperture or design by combining the first aperture and second apertures. The dose splits for the apertures can be replicated by using a grey filter or other similar device.

Figure 5:
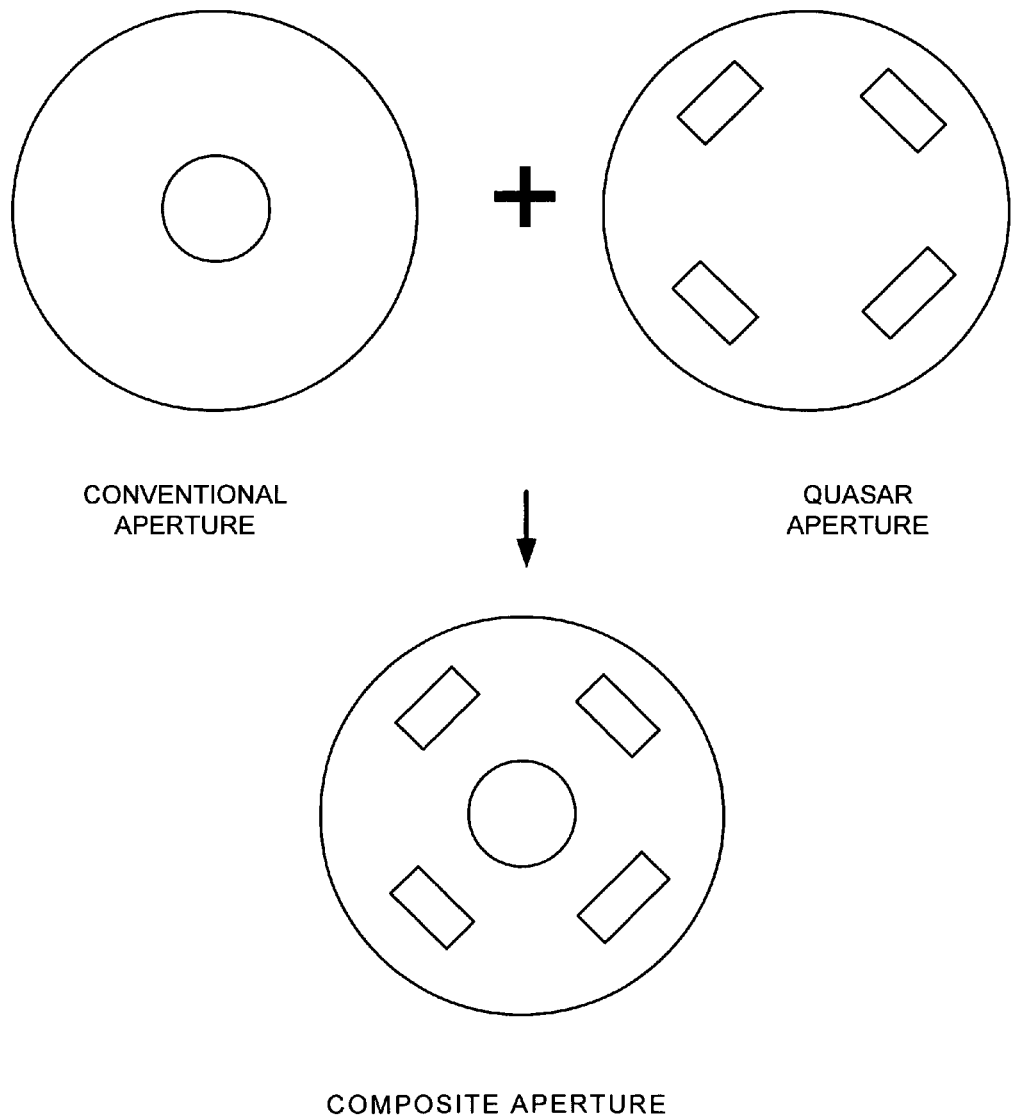
FIG. 5 shows the combination of a conventional aperture and a quadrupole aperture to make a composite aperture according to the third example embodiment of the invention.

For example, referring to FIG. 5, if the first aperture is a conventional aperture and the second aperture is a quasar aperture, then we could combine the two apertures to form the composite aperture (e.g., soft quasar). On the composite aperture, the conventional opening and the quasar openings are the same size and same relative location as in the original conventional aperture and the quasar aperture.

Next, we design a modulating device (e.g., a modulating means) for modulating the relative transmission through the first aperture and second aperture to allow the first and second exposure dose splits thru the first and second apertures in of the composite aperture or design.

Figure 6:
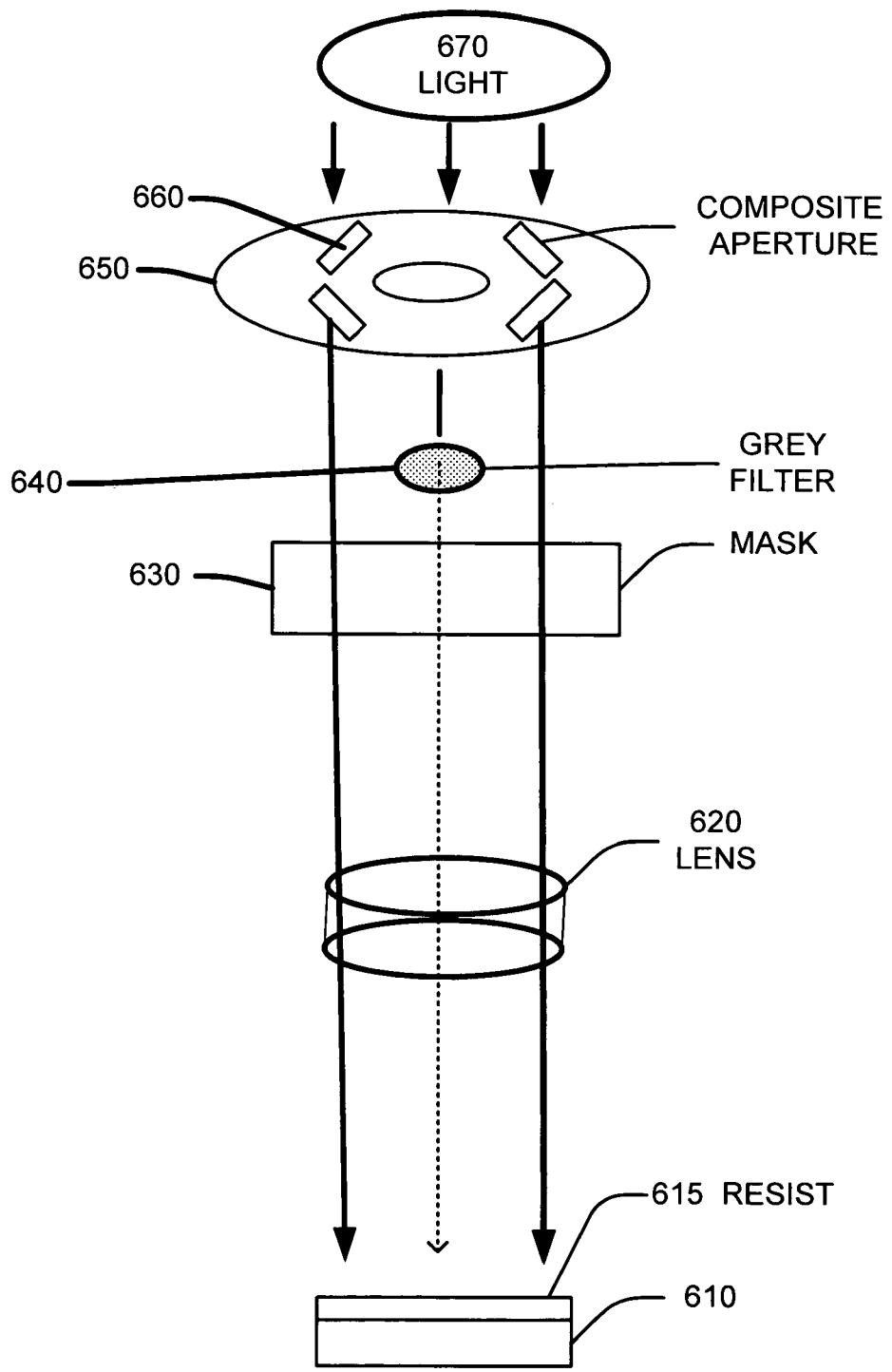
FIG. 6 shows an exposure process using the composite aperture and a modulating means according to an example embodiment of the invention.

For example, referring to FIG. 6, we can place a modulating means, such as a grey filter or any other device in the path of the light passing through the conventional opening in the composite aperture so to reduce (or change) the light that passes through the conventional opening and reaches the resist over the substrate.

In this way, we have optimized both the type patterns, the pattern fidelity parameter.

A. Aspect—an Exposure Tool—Composite Aperture and Modulation Means

A further aspect is an exposure tool comprised of (1) the composite aperture formed using the composite aperture design, and (2) the modulation device (or means) described above.

B. Single Exposure Process Using the Composite Aperture

A further aspect is a single exposure process using the composite aperture. FIG. 6 is an example illustration.

We form the composite aperture using the composite aperture design as describe above.

We provide a first reticle using the first reticle design.

We provide resist over a substrate.

We expose the resist using the photomask using the composite aperture and the modulating means.

In a preferred aspect the modulation means is comprised of a grey filter. The grey filter can be positioned so that light passing thru one or more apertures passes thru the grey filter.

V. Unexpected Results for the First Second and Third Example Embodiments

The example embodiment's linear superposition method produces an optimal photolithographic process for a given circuit layout and level. A key to this approach understanding that two critical elements of the process are linear. The first linear element is that the images from the optimized sub-components can be added to generate a composite image that is superior overall than any one process alone. This means that after each exposure in a multiple exposure system there is a latent image that is only developabe (able to be seen) after a specific energy or dose level has been surpassed. It is the additive process of these latent images that creates the composite image. It is linear because the composite image will have the additive properties of the sub-components according to their dose fractions (i.e. 80% Quasar give the image significantly more Quasar like performance than 20% Quasar). The second linear element is that once we determine the optimal process and dose split, we can create a composite aperture to produce the same process and reduce it from multiple exposures to single exposure. This is once again a linear approach, the composite aperture is just the addition of the multiple sub-components with the relative transmission of each related to the illuminated surface area for systems designed to deliver uniform brightness. Note that it is not obvious nor trivial that this linear aperture combination approach would work There should be in principle interaction terms that can create a difference between a composite aperture and a multiple exposure system. However, in our most recent work, we demonstrate that these terms are negligible compared to other sources of variation within the litho process.

VI. Illustrative Example

First and Second Example Embodiments

FIGS. 3A and 3B show simplified schematic representations of an example of the double exposure Pattern Fidelity Optimization Procedure for Multiple Exposure Scheme. This example shows a double exposure although 2 or more exposures are possible.

Following the steps described above, a reticle design for a reticle is provided.

We determine the required Pattern Fidelity parameter/metrics.

We determine to break the conventional single exposure process into 2 exposure steps that use different illumination modes (e.g., apertures). In this example, the first step will have a conventional illumination mode (conventional aperture) for a first pattern type region (e.g., line geometries features). In this example, the second illumination mode will use a quasar illumination mode (quasar aperture) for a second pattern type region (e.g., holes with another spatial frequency and other geometry features). Note that both pattern region are located on the same mask.

The illumination conditions (not dose) for each illumination mode are optimized for the chosen pattern type region (e.g., feature geometry, spacing, pitch ranges (spatial frequency lines). At this point both exposures are processes at full doses to achieve the proper CD.

Next, in a key step, we optimize the pattern fidelity parameter (litho performance metric) across the combined pattern type regions on the wafer by choosing a dose split for the exposure steps that maximizes the pattern fidelity metrics. The dose split is simply the fraction of the total energy given to each illumination mode (aperture type). Now that doses are determined we can use the double exposure process to make patterns in resist.

FIG. 3A shows a rough illustration of the first exposure step using the conventional illumination mode. Light passes thru the conventional aperture, thru the mask, thru the lens and onto the resist over a wafer. The first expose step using the first illumination mode is designed to better print the first pattern type region. It is important to note that the first dose (which is fraction of total dose as determined in the previous step) is chosen to optimize the pattern fidelity metrics for at least the first pattern type and the second pattern type regions on the reticle.

Next, referring to FIG. 3B, we perform a second exposure using the second illumination mode (here quasar aperture). A second dose light passes thru the same reticle onto the resist over the wafer (or other structure).

The resist is then developed.

VII. Example of the Third Embodiment

Composite Aperture for Single Exposure

In the example, the results form the multiple exposure pattern fidelity optimization are used to create a composite aperture for a single exposure processes.

FIG. 5 shows a rough illustration of the conventional aperture and the quasar aperture used in the example above. FIG. 5 shows the composite aperture which is an aperture with the openings from the conventional aperture and the quasar openings form the quasar aperture. The area and position of the openings in the composite apertures are the same as in the corresponding conventional and quasar apertures.

This composite aperture is now used in a single exposure process.

FIG. 6 shows a rough representation of an example of the third example embodiment—single exposure with modulated light through two type aperture openings of the composite aperture. FIG. 6 illustrates a composite aperture comprise of a center circular opening and a quadrupole aperture. The composite aperture 660 is shown in the aperture stop plate 650. In operation, light passes thru the openings in the composite aperture.

FIG. 6 shows, light source 670, composite aperture 660 in stop plate 650, grey filter 640, mask 630, lens 620, and resist 615 over substrate 610.

An important element is the modulation device 640 (e.g., means) for modulating the light dose transmitted thru the two aperture type opening (here conventional and quasar openings). In this example, a grey filter 640 is used as modulation means to achieve proper dose balance as in the first embodiment. If more light is passes through conventional opening (as determined by conventional opening area as compared to quasar opening area), a grey filter 640 is placed under the conventional opening to reduce the light through it. In this example, the grey filter is not placed in the path of light passing thru the quadrupole openings. The reverse is true (placing grey filter on quasar opening and not conventional) when the quasar opening is larger than conventional opening. This way the correct relative dose goes thru each opening type to achieve the optimal pattern fidelity metrics for the regions of the reticle.

FIG. 6 shows a representation composite aperture with a grey scale filter over conventional opening. In actual practice, the grey scale filter is most likely incorporated into the aperture. FIG. 6 is schematic drawing only, actual location of grey scale filter and aperture may differ by lense design.

The resist 615 over the wafer 610 is preferably exposed one time. The resist is then developed.

A. Non-Limiting Example Embodiments

In the above description numerous specific details are set forth in order to provide a more thorough understanding of the present invention. Those skilled in the art will realize that settings are equipment specific and will vary from one brand of equipment to another. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a device comprising:
providing a substrate prepared with photoresist;
providing a photomask comprising first and second mask pattern types;
providing a composite aperture comprising first and second aperture patterns the first aperture pattern improves performance of a first pattern fidelity parameter for the first mask pattern type and the second aperture pattern to improve the performance of a second pattern fidelity parameter for the second mask pattern type;
exposing the photoresist on the substrate with radiation from an exposure source through the composite aperture and photomask;
modulating the radiation from the exposure source during exposing to control radiation dose from at least one of the first and second aperture patterns; and
developing the photoresist to pattern the photoresist.

2. The method of claim 1 wherein:
the first pattern type is a nested feature; and
the second pattern type comprises an isolated contact.

3. The method of claim 1 wherein:
the first type pattern comprises Line/space features; and
the second type pattern comprises contact holes.

4. The method of claim 1 wherein:
the first and second pattern fidelity parameters comprise at least one of depth of focus, critical dimension (CD), mask error enhancement factor (MEEF), amount of line-end pullback, process window, common process window, necking, bridging, resist collapse, dose-to-size E1:1, dense to isolated feature bias, arbitrary feature size bias, sidelobe printing, film loss, sidewall angle, resolution; or weighted combinations thereof or weighted combinations of ranges thereof.

5. The method of claim 1 wherein modulating the radiation comprises a modulator.

6. The method of claim 5 wherein the modulator is disposed between the composite aperture and photomask.

7. The method of claim 5 wherein the modulator comprises a grey filter.

8. The method of claim 7 wherein the modulator is disposed between the composite aperture and photomask.

9. The method of claim 1 wherein modulating the radiation from the exposure source during exposing to control radiation dose from the first and second aperture patterns.

10. The method of claim 9 wherein modulating the radiation comprises a modulator disposed between the composite aperture and photomask.

11. The method of claim 1 wherein:
during the step of exposing the photoresist, a total exposure energy transmitted to the photoresist comprises a first dose transmitted via the first aperture pattern and a second dose transmitted via the second aperture pattern; and
the first and second dose is selected based on the performance of a first feature type in the first pattern type and a second feature type in the second pattern type.

12. The method of claim 1 wherein the device comprises a semiconductor device.

13. A method for fabricating a device comprising:
providing a substrate prepared with photoresist;
providing a photomask comprising first and second mask pattern types;
providing a composite aperture comprising first and second aperture patterns, the first aperture pattern improves performance of a first pattern fidelity parameter for the first mask pattern type and the second aperture pattern to improve the performance of a second pattern fidelity parameter for the second mask pattern type;

exposing the photoresist on the substrate with radiation from an exposure source through the composite aperture and photomask; and developing the photoresist to pattern the photoresist.

14. The method of claim 13 comprises modulating the radiation from the exposure source during exposing to control radiation dose from at least one of the first and second aperture patterns.

15. The method of claim 14 wherein modulating the radiation comprises a modulator disposed between the composite aperture and photomask.

16. The method of claim 13 comprises modulating the radiation from the exposure source during exposing to control radiation dose from the first and second aperture patterns.

17. The method of claim 13 wherein the device comprises a semiconductor device.

18. A method for fabricating a semiconductor device comprising:

providing a substrate prepared with photoresist;

providing a photomask comprising first and second mask pattern types;

providing a composite aperture comprising first and second aperture patterns, the first aperture pattern improves performance of a first pattern fidelity parameter for the first mask pattern type and the second aperture pattern to improve the performance of a second pattern fidelity parameter for the second mask pattern type;

exposing the photoresist on the substrate with radiation from an exposure source through the composite aperture and photomask;

modulating the radiation from the exposure source during exposing to control radiation dose from the first and second aperture patterns; and developing the photoresist to pattern the photoresist.

19. The method of claim 18 wherein modulating comprises a modulator.

20. The method of claim 18, wherein:

during the step of exposing the photoresist, a total exposure energy transmitted to the photoresist comprises a first dose transmitted via the first aperture pattern and a second dose transmitted via the second aperture pattern; and the first and second dose is selected based on the performance of a first feature type in the first pattern type and a second feature type in the second pattern type.

* * * * *